United States Patent [19]

Suzuki

[11] Patent Number: 5,168,428

[45] Date of Patent: Dec. 1, 1992

[54] CIRCUIT SUBSTRATE SUPPORTING STRUCTURE

[75] Inventor: Yuji Suzuki, Kanagawa, Japan

[73] Assignee: Sony Corporation, Tokyo, Japan

[21] Appl. No.: 795,524

[22] Filed: Nov. 21, 1991

[30] Foreign Application Priority Data

Nov. 30, 1990 [JP] Japan ............................ 2-129529[U]

[51] Int. Cl.⁵ ....................... H05K 1/18; H01R 23/70
[52] U.S. Cl. .................... 361/395; 361/413; 439/76
[58] Field of Search .............. 439/60, 61, 76, 79, 439/80; 248/510; 361/395, 399, 413

[56] References Cited

U.S. PATENT DOCUMENTS

| | | |
|---|---|---|
| 4,221,458 | 9/1980 | Hughes et al. ............... 439/79 X |
| 4,392,701 | 7/1983 | Weidler ....................... 439/76 |
| 4,399,487 | 8/1983 | Neumann ................... 361/395 X |
| 4,591,950 | 5/1986 | Houpt .......................... 361/399 |
| 4,939,623 | 7/1990 | Equi et al. .................... 361/399 |
| 5,091,826 | 2/1992 | Arnett et al. ................ 439/76 X |

Primary Examiner—Leo P. Picard
Assistant Examiner—Michael W. Phillips
Attorney, Agent, or Firm—Philip M. Shaw, Jr.

[57] ABSTRACT

A circuit substrate supporting structure for electronic components includes a circuit substrate, one side edge of which projects beyond a chassis of the component, a connector being mounted thereon from which a plug may be inserted or removed. The substrate projects from a lower base portion of the chassis. The connector is arranged on the projecting substrate, such that the engaging portion of the connector is faced away from the chassis. The chassis is covered with a shield case having a rear wall portion situated slightly above the upper surface of the connector such that the connector is between the substrate and the lower edge of the wall portion. The wall portion is formed with a stopper projecting from the lower edge in the vicinity of the connector for tightly retaining the connector between the stopper and the substrate to resist bending stress caused by the insertion and removal of the plug.

14 Claims, 2 Drawing Sheets

CIRCUIT SUBSTRATE SUPPORTING STRUCTURE

BACKGROUND OF THE INVENTION

1. Field of The Invention

The present invention relates generally to a support structure for a circuit substrate of electronic components. Particularly the present invention relates to a support structure for a circuit substrate applicable to electronic components such as microfloppy disc drives, for stably retaining the substrate for resisting stress applied thereto especially during the insertion or removal of a connecting plug.

2. Description of The Background Art

Conventionally, in such electronic components as microfloppy disc drives, or other components which require external connection, chassis design calls for a connector to be provided so as to be accessible for inserting a plug to connect the unit to other components in a system. Conventionally and conveniently, the connector is usually located on a rear section of the unit. The connector thus usually protrudes from the back of the unit when installed.

For clarity, the structure of a conventional unit will be discussed with reference to FIGS. 1 and 2.

To facilitate connection, a connector 5 must be mounted facing away from the main chassis 2 of the unit, and is installed on a strip of the substrate 1 which protrudes outside of the main chassis. The main chassis is secured to the substrate by a screw 3. The main chassis is then covered with a shell, or shield case 6, which then comprises the top and sides of the unit. The connector 5 is therefore located at a position between the protruding substrate and the rear wall of the cover. The rear wall of the cover does not cover the entire rear of the unit but rather, covers only an upper section thereof to leave space for a plug to access the connector.

According to the above construction a drawback therefore arises in that a gap G remains between a top surface of the connector 5 and the lower edge of the rear wall of the shield case 6. This gap leads to a certain amount of play being present in the finished unit and, due to the flexibility of the substrate 1, the substrate 1 is subjected to bending stress when a plug 4 is inserted into, or removed from, the connector 5. This bending stress is applied particularly in a direction A, as shown in FIG. 2. This situation can easily lead to breakage and/or malfunction of delicate electronic circuits on the substrate 1. However, to manufacture and assemble such units to exact tolerances which would prevent the formation of such a gap is time consuming and expensive.

SUMMARY OF THE INVENTION

It is therefore a principal object of the present invention to provide a support structure for circuit substrate which avoids the disadvantages of the prior art.

It is a further aspect of the present invention to provide a support structure for circuit substrate which may be simply and economically manufactured.

It is a still further aspect of the present invention to provide a support structure for circuit substrate which may stably retain the substrate for resisting stress applied thereto.

In order to accomplish the aforementioned and other objects, a support structure for circuit substrate according to the present invention comprises: a chassis; a circuit substrate member attached to the chassis such that an edge portion of the substrate protrudes outside of the chassis; a housing member, the housing member covering a portion of the chassis and having a face portion oriented perpendicular to the edge portion of the substrate and situated between a wall of the chassis contacting the substrate and the outer periphery of the edge portion such that a space exists between the bottom edge of the face portion and the surface of the substrate; a connector, the connector mounted on the protruding edge portion of the substrate in the space between the substrate surface and the bottom edge of the face portion such that a portion of the connector protrudes outside the space; a stopper member, associated with a lower area of the face portion, the stopper extending below the bottom edge of the face portion so as to contact the top surface of the connector thus securely holding the connector between the face portion and the substrate.

According to the structure of the invention the stopper may be formed integrally with the face portion. Further, the stopper may be shaped to extend outside a plane of the face portion.

According to another aspect of the present invention, a disc drive unit is provided which comprises: a chassis; a circuit substrate member attached to the chassis such that an edge portion of the substrate protrudes outside of the chassis; a housing member, the housing member having a planar top portion and two parallel planar side members of equal height and a rear wall portion oriented perpendicular to the edge portion of the substrate, the rear wall portion having a height which is less than that of the side members and situated between a wall of the chassis contacting the substrate and the outer periphery of the edge portion such that when a bottom edge of the side members are on a plane of the substrate a space exists between a bottom edge of the rear wall portion and the surface of the substrate; a connector, the connector mounted on the protruding edge portion of the substrate in the space between the substrate surface and the bottom edge of the rear wall portion such that a portion of the connector protrudes outside the space; a stopper member, associated with a lower area of the face portion, the stopper member extending below the bottom edge of the rear wall portion so as to firmly contact the top surface of the connector, thus securely holding the connector between the rear wall portion and the substrate.

In the disclosed embodiment of the invention, the connector of the disc drive is a 36 pin connector.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Figure 1:
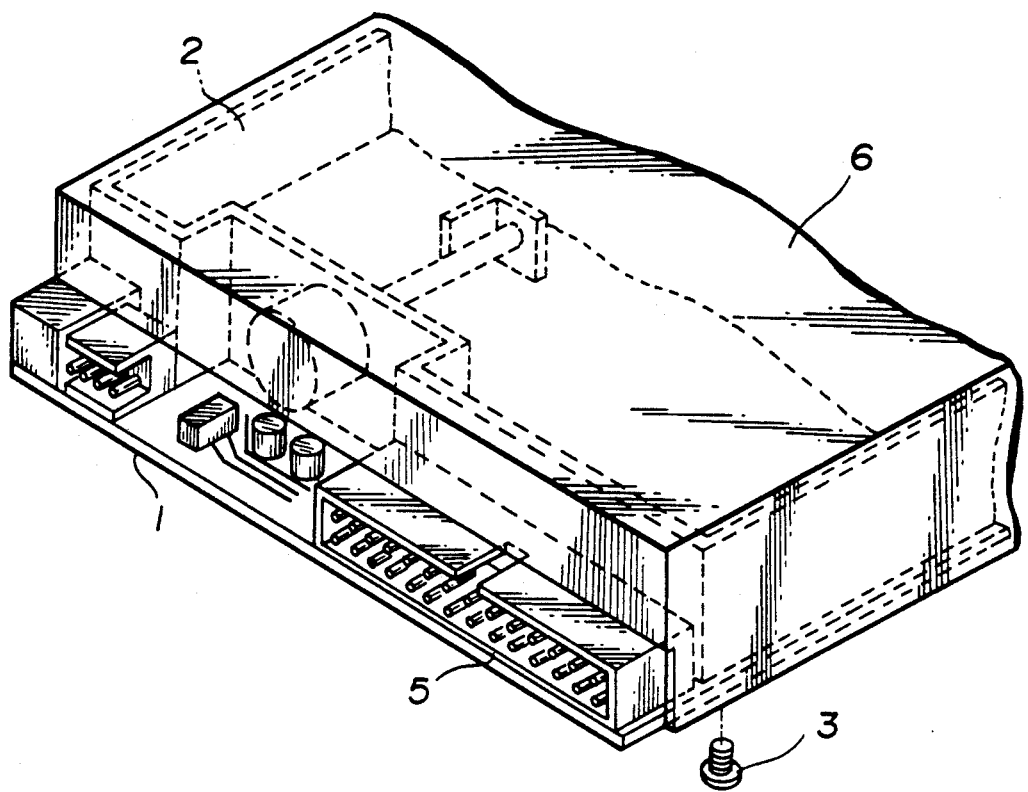
FIG. 1, is a perspective view of a conventional circuit substrate supporting structure.
Figure 2:
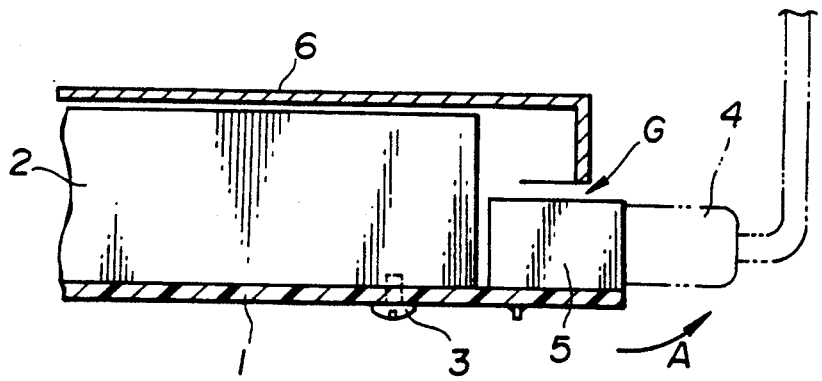
FIG. 2, is a cross sectional view of the conventional supporting structure of FIG. 1.
Figure 3:
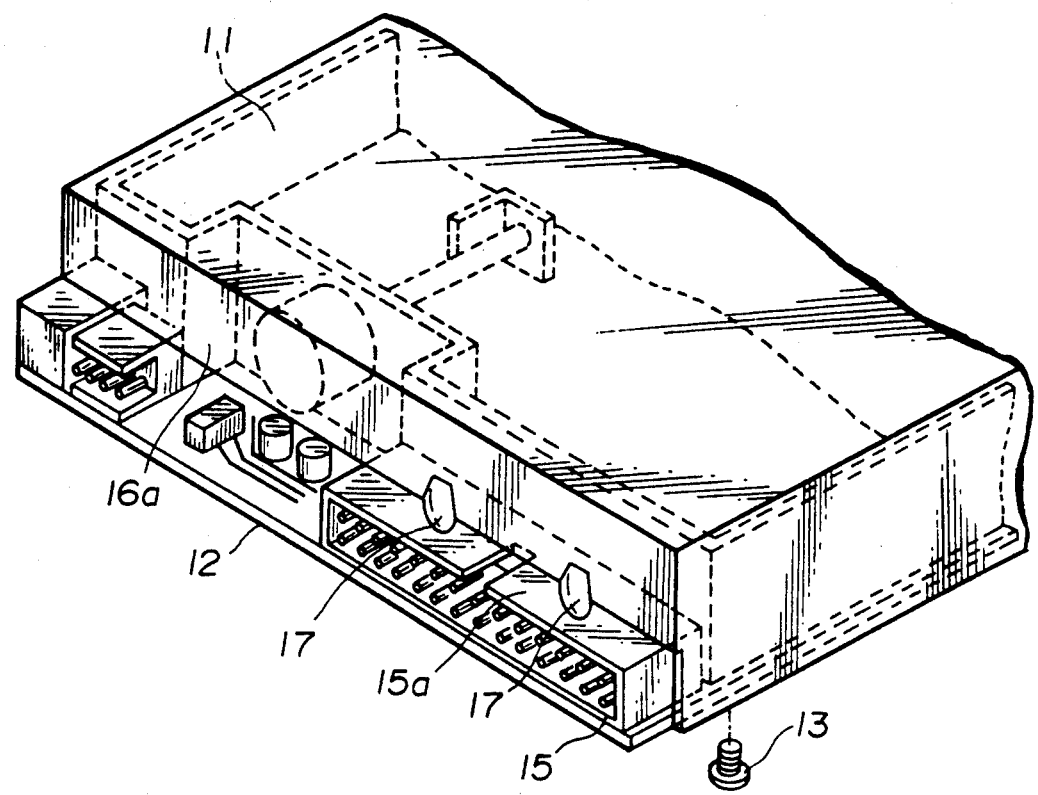
FIG. 3, is a perspective view of a supporting structure for circuit substrate according to the present invention.
Figure 4:
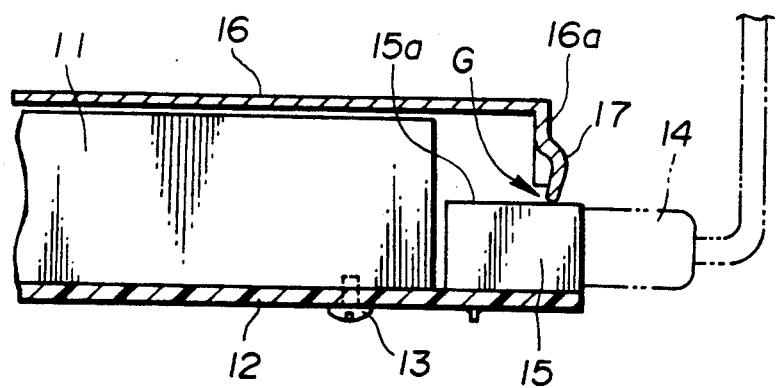
FIG. 4, is a cross sectional view of the supporting structure of FIG. 3.

Referring now to the drawings, FIGS. 3 and 4 show a circuit substrate supporting structure according to the present invention. Numeral 11 refers to a chassis of a microfloppy disc drive, which device is used as an example only. The chassis has front and back faces which are parallel to each other and attached to the substrate 12 by screws or the like (for simplicity, only one screw is shown in the drawings). Along a rear portion of the chassis, an edge of the substrate protrudes forming a shelf like substrate portion at a rear side of the unit. On the protruding edge of the substrate, a connector 15 for receiving a plug 14 therein, is mounted on the substrate 12 outside of the chassis 11. The connector may be attached by soldering, or the like. In the present embodiment, the connector refers to a 36 pin connector, however it will be understood that alternate types of connectors may also be utilized.

The chassis 11 is covered by a shield case 16, made of sheet metal, or the like. the shield case forms the outer surface of the unit and protects circuitry mounted within the chassis 11. The shield case 16 has a back face 16a which is perpendicular to the substrate 12. The back face 16a extends downward from the top surface of the shield case 16 so as to partially cover a back portion of the unit while leaving a space between the bottom edge thereof and the substrate 12. The connector 15 is mounted within the space between the substrate 12 and the back face 16a so as to protrude beyond the back face 16a of the shield case 16. It will be noted that the connector 15 is mounted such that a pin, or plug engaging portion thereof faces outwardly, away from the chassis 11 and that a rearmost edge of the substrate 12, with the connector 15 mounted thereon, extends outside of the back face 16a of the shield case 16.

In a narrow space remaining between a top surface of the connector 15 and the bottom edge of the back face 16a, two stoppers 17 are formed. The stoppers extend below the bottom edge of the back face 16a so as to contact an uppers surface 15a of the connector such that the connector is squeezed between the substrate 12 and the stoppers 17. The stoppers 17 may be constructed so as to apply firm pressure on the connector 15. This effectively closes the gap G, as no bending motion of the substrate 12 during insertion or removal of the plug 14 may occur as the substrate 12 and the connector 15 are effectively reinforced by the shield case 16 via the back face 16a and the stoppers 17.

Thus, according to the present invention, the circuit substrate support structure wherein stoppers are protruded from a bottom edge of a housing so as to contact a top of a connector mounted on a substrate, may be advantageously applied to an electronic unit having an in/out connector mounted on a substrate, such as a microfloppy disc drive.

Further, the method of using stoppers may be applied advantageously prevent bending stress from being applied to circuit substrate and thus protect an electronic unit from possible malfunction. It will be noted that the advantages of the present invention may be advantageously applied to any electronic apparatus requiring external connection.

Finally, the structure disclosed in the above descritpion may be economically implemented in a manufacturing stage and may easily be adapted to a number of types of electronic units and various connector sizes without significant retooling. Thus costs may be held low while sufficient reliability of the product is assured.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A circuit substrate supporting structure for electronic apparatus including external connection means, comprising:
    a chassis;
    a circuit substrate member attached to said chassis such that an edge portion of said substrate protrudes outside of said chassis;
    a housing member, said housing member covering a portion of said chassis and having a face portion oriented perpendicular to said edge portion of said substrate and situated between a wall of the chassis contacting the substrate and the outer periphery of said edge portion such that a space exists between the bottom edge of said face portion and the surface of the substrate;
    a connector, said connector mounted on said protruding edge portion of said substrate in the space between the substrate surface and said bottom edge of said face portion such that a portion of said connector protrudes outside said space;
    a stopper member, associated with a lower area of said face portion, said stopper extending below said bottom edge of the face portion so as to contact said top surface of the connector thus securely holding said connector between the face portion and the substrate.

2. A substrate supporting structure as set forth in claim 1, wherein said stopper is formed integrally with said face portion.

3. A substrate supporting structure as set forth in claim 1, wherein said stopper is shaped to extend outside a plane of said face portion.

4. A substrate supporting structure as set forth in claim 1, wherein said connector is a 36 pin connector.

5. A substrate supporting structure as set forth in claim 1, wherein said connector is mounted so as to face away from said chassis.

6. A substrate supporting structure as set forth in claim 1, wherein the stopper member is so constructed as to apply firm pressure against the top surface of said connector.

7. A substrate supporting structure as set forth in claim 1, wherein a plurality of stopper members are employed.

8. A disc drive unit comprising:
    a chassis;
    a circuit substrate member attached to said chassis such that an edge portion of said substrate protrudes outside of said chassis;
    a housing member, said housing member having a planar top portion and two parallel planar side members of equal height and a rear wall portion oriented perpendicular to said edge portion of said substrate, said rear wall portion having a height which is less than that of said side members and situated between a wall of the chassis contacting the substrate and the outer periphery of said edge portion such that when a bottom edge of said side members are on a plane of said substrate a space exists between a bottom edge of said rear wall portion and the surface of the substrate;

a connector, said connector mounted on said protruding edge portion of said substrate in the space between the substrate surface and said bottom edge of said rear wall portion such that a portion of said connector protrudes outside said space;

a stopper member, associated with a lower area of said face portion, said stopper member extending below said bottom edge of the rear wall portion so as to firmly contact said top surface of the connector, thus securely holding said connector between the rear wall portion and the substrate.

9. A disc drive unit as set forth in claim 8, wherein said stopper is formed integrally with said rear wall portion.

10. A disc drive unit as set forth in claim 8, wherein said stopper is shaped to extend outside a plane of said rear wall portion.

11. A disc drive unit as set forth in claim 8, wherein said connector is a 36 pin connector.

12. A disc drive unit as set forth in claim 8, wherein said connector is mounted so as to face away from said chassis.

13. A substrate supporting structure as set forth in claim 8, wherein the stopper member is so constructed as to apply firm pressure against the top surface of said connector.

14. A substrate supporting structure as set forth in claim 8, wherein a plurality of stopper members are employed.

* * * * *